(12) United States Patent
Yamauchi et al.

(10) Patent No.: US 6,459,829 B1
(45) Date of Patent: Oct. 1, 2002

(54) MULTIPLE WAVELENGTH EXCITATION OPTICAL MULTIPLEXING DEVICE, MULTIPLE WAVELENGTH EXCITATION LIGHT SOURCE INCORPORATING AFOREMENTIONED DEVICE, AND OPTICAL AMPLIFIER

(76) Inventors: Ryozo Yamauchi, c/o Fujikura Ltd., Sakura Works, 1440, Mutsuzaki, Sakura-shi, Chiba-ken (JP); Akira Wada, c/o Fujikura Ltd., Sakura Works, 1440, Mutsuzaki, Sakura-shi, Chiba-ken (JP); Kenji Nishide, c/o Fujikura Ltd., Sakura Works, 1440, Mutsuzaki, Sakura-shi, Chiba-ken (JP); Shigefumi Yamasaki, c/o Fujikura Ltd., Sakura Works, 1440, Mutsuzaki, Sakura-shi, Chiba-ken (JP)

( * ) Notice: Subject to any disclaimer, the term of this patent is extended or adjusted under 35 U.S.C. 154(b) by 0 days.

(21) Appl. No.: 09/497,343

(22) Filed: Feb. 3, 2000

(30) Foreign Application Priority Data

Feb. 10, 1999 (JP) .............................. 11-033524

(51) Int. Cl.[7] .............................. G02B 6/28; G02B 6/26
(52) U.S. Cl. .............................. 385/24; 385/15; 385/31; 385/11
(58) Field of Search .............................. 385/24, 17, 11, 385/37, 15, 31; 359/133, 134, 115, 122, 341.1, 349; 372/6, 99, 102

(56) References Cited

U.S. PATENT DOCUMENTS

| | | | |
|---|---|---|---|
| 5,327,515 A | 7/1994 | Anderson et al. | 385/123 |
| 5,337,382 A | 8/1994 | Mizrahi | 385/37 |
| 5,478,371 A | 12/1995 | Lemaire et al. | 65/384 |
| 5,694,248 A | 12/1997 | Erdogan et al. | 359/570 |
| 5,748,811 A * | 5/1998 | Amersfoort et al. | 385/15 |
| 5,760,949 A * | 6/1998 | Motoshima et al. | 359/341 |
| 5,809,190 A | 9/1998 | Chen | 385/43 |
| 5,936,763 A * | 8/1999 | Mitsuda et al. | 359/341 |
| 6,052,394 A * | 4/2000 | Lee et al. | 372/6 |
| 6,130,899 A * | 10/2000 | Epworth et al. | 372/6 |
| 6,212,310 B1 * | 4/2001 | Waarts et al. | 385/24 |
| 6,226,311 B1 * | 5/2001 | Meliga et al. | 372/102 |
| 6,229,937 B1 * | 5/2001 | Nolan et al. | 385/24 |

FOREIGN PATENT DOCUMENTS

EP          0 268 523          5/1988

OTHER PUBLICATIONS

"A stablised fibre–optic Mach–Zehnder interferometer filter using an independent stabilisation light source", Ahn, et al., May, 1998, Elsevier Science B.V. 1998, pp. 63–66.

"Arrayed–waveguide grateing lasers and their applications to tuning–free wavelength routing", Tachikawa, et al., Oct. 1996, IEEE Proc.–Optoelectron., Vol. 143, No. 5, Oct. 1996. pp. 322–328.

"Lightwave Applications of Fiber Bragg Gratings", C.R. Giles, Aug. 1997, IEEE Vol. 15, No. 8, pp. 1391–1404.

European Search Report EP 00 40 0367 May–29–023, 3 pages.

* cited by examiner

Primary Examiner—Rodney Bovernick
Assistant Examiner—Juliana K. Kang
(74) Attorney, Agent, or Firm—Burns, Doane, Swecker & Mathis, L.L.P.

(57) ABSTRACT

The present invention provides a multiple wavelength excitation light source characterized in the provision of an optical multiplexing element that has a plurality of input terminals connected to lasers and functions to multiplex a plurality of lights that have different characteristics; and a reflecting element inserted near the output side of the output terminal of the optical multiplexing element, and functioning to reflect the light multiplexed at the optical multiplexing element at a low reflection coefficient. Accordingly, it becomes possible to provide high output excitation light in a stable manner.

4 Claims, 12 Drawing Sheets

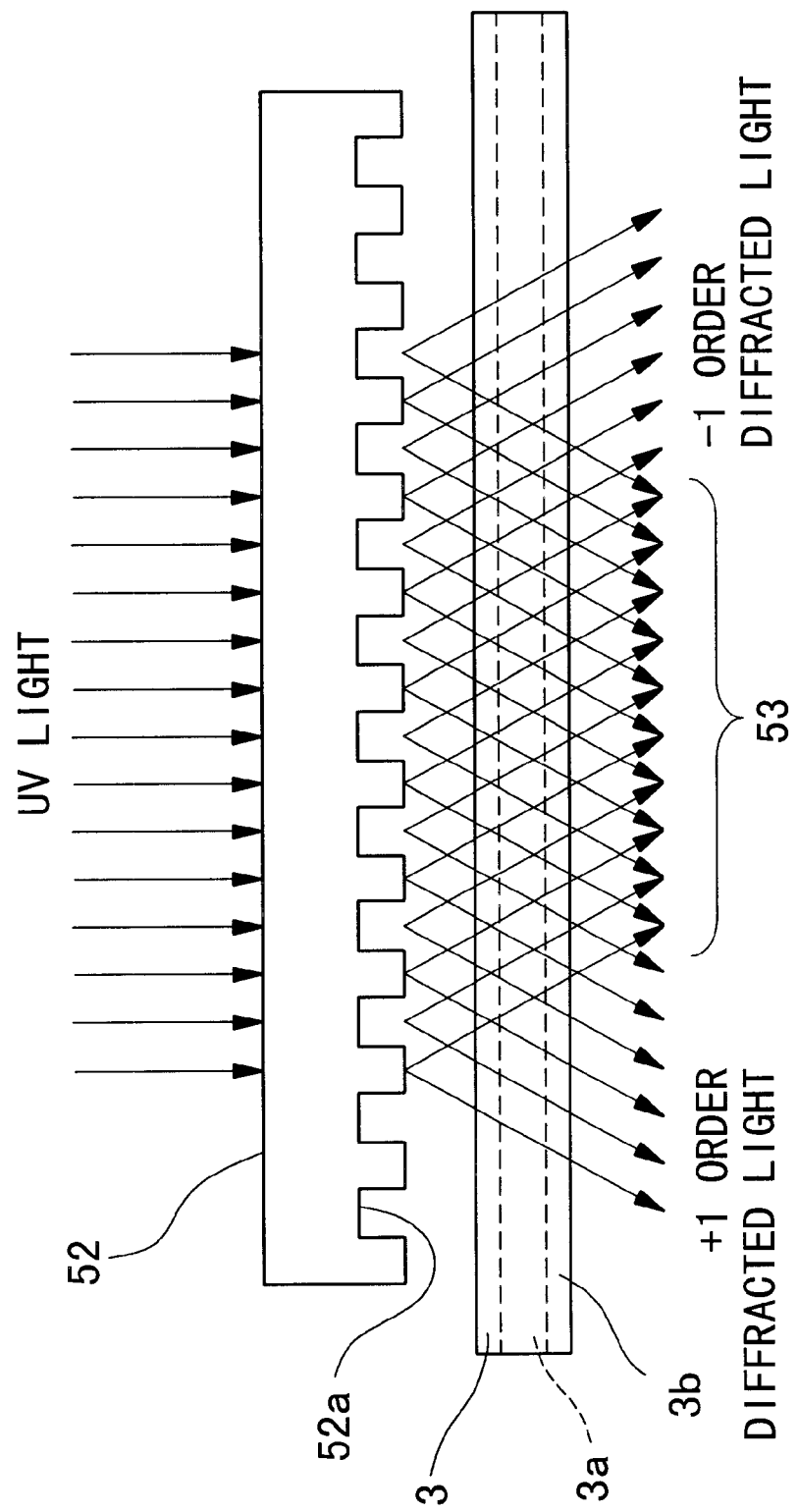

MULTIPLE WAVELENGTH EXCITATION OPTICAL MULTIPLEXING DEVICE, MULTIPLE WAVELENGTH EXCITATION LIGHT SOURCE INCORPORATING AFOREMENTIONED DEVICE, AND OPTICAL AMPLIFIER

BACKGROUND OF THE INVENTION

1. Field of the Invention

The present invention relates to an optical amplifier employed in optical fiber communications, optical measurements, or laser processing, and to the excitation light source for the laser thereof, the present invention providing a means for obtaining a higher output product.

The present specification is based on a patent application filed in Japan (Japanese Patent Application No. Hei 11-33524), a portion of the aforementioned application being incorporated herein by reference.

2. Description of the Related Art

FIG. 10A is a schematic structural diagram showing an example of a conventional long distance optical fiber communications system. As shown in this figure, in this conventional communications system, it is necessary to perform regenerative repetition every several tens km along optical fiber 3 joining transmitter 1 and receiver 2, in which an optical/electrical conversion, and then an electrical/optical conversion, are performed on the optical signal by regenerative repeaters 4, 4.

FIG. 10B shows an example of the structure of this regenerative repeater 4. The optical signal from optical fiber 3 on the transmitter 1 side undergoes optical/electrical conversation by passing through light detector 5, waveform shaping circuit 6, laser driver 7 and laser 8. The signal then undergoes electrical/optical conversion, and is sent to optical fiber 3 on the receiver 2 side.

Due to progress in optical technology, it has become possible to obtain a high output laser inexpensively in recent years. Thus, as shown in FIG. 11A, an optical amplifier 10 is inserted along optical fiber 3, in between transmitter 1 and receiver 2, to realize a long distance optical fiber communications system in which the light signal is directly amplified by optical amplifier 10.

FIG. 11B shows an example of the structure of optical amplifier 10. In optical amplifier 10, a rare-earth doped optical fiber 11 is the active media in which the amplification is actually carried out. The optical signal is amplified by inputting excitation light from laser 14 (excitation light source) to rare-earth doped optical fiber 11, via an optical fiber 13 which is connected to optical multiplexing element 12 provided at the front of rare-earth doped optical fiber 11. This amplified optical signal is then output from rare-earth doped optical fiber 11.

Isolator 15, which is toward the rear of rare-earth doped optical fiber 11, is provided to stabilize the operation of laser 14 by preventing feedback light.

By realizing an optical amplifier in this way, the attenuated optical signal is directly amplified, so that transmission without regenerative repetition is possible, even in the case of transmission over several thousand kilometers.

In current optical fiber communications, a 1.5 $\mu$m band amplifying erbium doped optical fiber known for its high efficiency is primarily used for rare-earth doped optical fiber 11.

The absorption spectrum of the rare-earth element for forming rare-earth doped optical fiber 11 will differ depending on the type of rare-earth element employed. For example, as shown in FIG. 12, an erbium doped optical fiber has absorption spectrums of a comparatively broad wavelength width near 980 nm and 1480 nm. Thus, in a 1.5 $\mu$m band amplifying erbium doped optical fiber amplifier (denoted as "EDFA" hereinafter), a 1.5 $\mu$m band optical signal typically can be amplified using excitation light near 0.98 $\mu$m or 1.48 $\mu$m.

Typically, a semiconductor laser is employed as a laser 14 for oscillating the excitation light. Of these, a Fabry-Perot semiconductor laser (referred to as a "Fabry-Perot laser", hereinafter) is mainly used in which power can be obtained relatively inexpensively.

On the other hand, a wavelength multiplex mode optical fiber communications system has been realized for multiplex transmission of signal lights having a plurality of wavelengths. Thus, it has become possible to further increase the amount of information which can be transmitted by one optical fiber.

When carrying out wavelength multiplex communications in the optical communications system shown in FIG. 11A, the output required of optical fiber amplifier 10 is greater than in the case where transmitting a single wavelength. For this reason, the power of the excitation light supplied from laser 14 is also required to be greater.

As a method for increasing the total power of the excitation light, a method may be considered in which the output of the laser is increased, for example. There is a limit to this approach, however, since the output of a typical laser is limited. As a result, sufficient effects cannot be obtained.

Thus, the following method may be considered.

Namely, a plurality of lasers is prepared. These lasers oscillate light in a wavelength band capable of exciting the rare-earth element in the rare-earth doped optical fiber, and have oscillation wavelengths which differ slightly from one another. The lights output from these lasers are multiplexed, and this multiplexed light is used as the excitation light.

For example, as shown in FIG. 12, the wavelength width in the excitation wavelength band around 1.48 $\mu$m in an EDFA is on the order of 1.45~1.49 $\mu$m, and the excitation wavelength width around 0.98 $\mu$m is on the order of several nm. These excitation wavelength widths are comparatively broad. Thus, when a plural lights having different wavelengths respectively within this wavelength band are multiplexed, the total of the various powers of the light becomes the power of the excitation light.

In other words, when n lasers are prepared, it is theoretically possible to obtain n-fold greater power as compared to the case where employing just one laser (assuming no loss when multiplexing, etc.).

However, as shown in FIG. 13, numerous vertical modes are present in the oscillation wavelengths of the Fabry-Perot laser that is typically used as laser 14. These oscillation wavelengths have a broad wavelength width on the order of 15~20 nm. In general, multiplexing a plurality of lights having this type of broad wavelength width is difficult. However, polarized waves are present in the light output from a Fabry-Perot laser. For this reason, a method is performed for obtaining excitation light of a two-fold greater power by multiplexing two polarized waves that are perpendicular to one another. In theory, however, in this method as well, it is not possible to obtain excitation light having a power in excess of two-fold greater than normal.

Moreover, when lights having too broad oscillation wavelength widths are multiplexed, the width of the wavelength band of the multiplexed light is crowded out of the excitation wavelength band, decreasing efficacy as excitation light.

Accordingly, the following method may be considered.

First, as shown in FIG. 14A, a reflecting element 20b (external resonator) for reflecting light in a specific narrow wavelength band at a low reflection coefficient is attached to the rear of Fabry-Perot laser 20a.

The combination of Fabry-Perot laser 20a and reflecting element 20b is formed to have a structure identical to the so-called Distributed Bragg Reflector laser (DBR laser), in which one of the reflecting surfaces of a Fabry-Perot laser is substituted with a DBR (distributed Bragg reflector). In other words, a laser oscillating element 20 is formed which oscillates only light in the wavelength band that is selectively reflected by reflecting element 20b.

As a result, the light obtained via reflecting element 20b is rendered into a narrow spectrum as shown in FIG. 14B.

FIG. 15A shows an example of a light source for multiple wavelength excitation in wavelength multiplex mode employing a laser oscillating element consisting of this type of Fabry-Perot laser and reflecting element, and shows the design of an optical amplifier incorporating the aforementioned light source. FIG. 15A is a schematic structural diagram showing an example in which this optical amplifier is employed in an optical communications system using a wavelength multiplex transmission mode.

Namely, n laser oscillating elements as described above are prepared.

In the figure, the numeral 21 is a laser oscillating element for oscillating light in a narrow band region centered on wavelength 1. Laser oscillating element 21 is composed of Fabry-Perot laser 21a and reflecting element 21b. Similarly, laser oscillating element 22 for oscillating light centered on wavelength $\lambda 2$ is composed of Fabry-Perot laser 22a and reflecting element 22b. The nth laser oscillating element 23 consists of Fabry-Perot laser 23a and reflecting element 23b, and oscillates light centered on wavelength $\lambda n$.

The oscillation wavelengths $\lambda 1, \lambda 2, \ldots \lambda n$ of these laser oscillating elements 21, 22 . . . 23 are set so as to differ at suitable wavelength intervals.

When employing an erbium doped optical fiber as rare-earth doped optical fiber 11, a plurality of laser oscillating elements are prepared having oscillation wavelengths which differ at specific intervals in the 980 nm and 148 nm excitation wavelength bands, to form an optical amplifier as shown in FIG. 15A.

In this multiple wavelength excitation light source, the lights oscillated from these laser oscillating elements 21, 22 . . . 23 are input respectively to the input terminals 24a, 24b . . . 24c of optical multiplexing element 24, multiplexed at multiplexing element 24, and then output from output terminal 24d. In this multiplexed light, as shown in FIG. 15B, a wavelength spectrum is obtained in which a plurality of peaks $\lambda 1, \lambda 2 \ldots \lambda n$ are aligned. The peaks $\lambda 1, \lambda 2, \ldots \lambda n$ have narrow wavelength widths respectively. The power of this multiplexed light is the sum of the respective powers of these peaks.

This multiplexed light is input to rare-earth doped fiber 11 via optical multiplexing element 12. As a result, the optical signal of $\lambda 1', \lambda 2', \ldots \lambda n'$ which was propagated through transmission optical fiber 3 employing a wavelength multiplexing mode and input to rare-earth doped optical fiber 11 is amplified due to the excitation effect of this multiplexed light.

However, the following problems are present in the method shown in FIG. 15A for multiplexing light having a plurality of different wavelengths.

The first problem is that a high wavelength accuracy is required of reflecting elements 21b, 22b . . . 23b.

This is because the oscillation wavelength must be made to strictly correspond to each laser oscillating element 21, 22, . . . 23. Further, when the wavelength accuracy of reflecting element 21b is low, the oscillation wavelength is not stabilized, so that multiplexed light having a large power cannot be obtained.

For example, when using a 980 nm band as the excitation wavelength band when forming an EDFA, a plurality of reflecting elements 21b, . . . 23b having the reflecting wavelength characteristics 977 nm, 978.5 nm, 980 nm, and 981.5 nm, respectively, are prepared, and the oscillation wavelengths of respective laser oscillating elements 21 , . . . 23 must be matched. In other words, since the oscillation wavelengths of the plurality of laser oscillating elements 21, . . . 23 are adjacent, considerably high accuracy is required of reflecting elements 21b, . . . 23b.

In addition to the first problem, there is a second problem in that the oscillation wavelengths of laser oscillating elements 21, . . . 23 must match the transmission wavelength characteristics of optical multiplexing element 24 in which these oscillation wavelengths are multiplexed.

If they do not match, then the lights oscillated from laser oscillating elements 21, . . . 23 are damped at optical multiplexing element 24, and are not transmitted to the output side of optical multiplexing element 24 with high efficiency.

Moreover, this phenomenon is a relative one. Even if the above-described first problem is resolved and the respective oscillation wavelengths from laser oscillating elements 21, . . . 23 are stable, if the transmission wavelength of optical multiplexing element 24 varies, then the light is damped at optical multiplexing element 24, and the power of the multiplexed light changes greatly.

However, the transmission wavelength characteristics of optical multiplexing element 24 are highly dependent on temperature.

For example, optical multiplexing element 24 is assumed to have a temperature dependence of 0.013 nm/°C. In the case where temperature compensation is not carried out for optical multiplexing element 24, when the employed temperature environment changes 50° C. in the temperature range, then the transmission wavelength parallel shifts by just 0.65 nm on the wavelength axis. In this case, the transmission wavelength of optical multiplexing element 24 is at cross purposes with the oscillation wavelength of laser oscillating elements 21, . . . 23, and the transmission loss at optical multiplexing element 24 increases sharply. Accordingly, strict temperature compensation for optical multiplexing element 24 has been required.

On the other hand, when temperature control is not carried out for the oscillation wavelength of Fabry-Perot lasers 21a, . . . 23a, it is known that when, for example, the temperature changes from 0° C. to 40° C., the central wavelength changes by 10 nm or more. Accordingly, strict temperature compensation for Fabry-Perot lasers 21a, . . . 23a is required in order to make the reflected wavelength from reflecting elements 21b, . . . , 23b and the transmitted wavelength from optical multiplexing element 24 match the oscillation wavelength of Fabry-Perot lasers 21a, . . . 23a.

This type of high output is demanded not only in the optical communications field, but also in optical amplifiers and their laser excitation light sources which are used in optical measurements, laser processing and the like.

SUMMARY OF THE INVENTION

The present invention relates to a multiple wavelength excitation optical multiplexing device capable of outputting high output excitation light, a light source incorporating this device, and an optical amplifier incorporating this device, and is directed to the provision of a device in which the characteristics do not readily change in response to temperature variations.

In addition, the present invention is also directed to the provision of a device in which the structural parts are not required to have as high a wavelength accuracy as demanded in the conventional art.

It is also the present invention's objective to provide a multiple wavelength excitation optical multiplexing device, a light source incorporating this device, and an optical amplifier incorporating this device which are capable of reducing temperature control for the structural parts.

The following means of resolution are provided in the present invention.

Namely, a multiple wavelength excitation optical multiplexing device is formed characterized in the provision of an optical multiplexing element that has a plurality of input terminals connected to lasers and functions to multiplex a plurality of lights that have different characteristics; and a reflecting element inserted near the output side of the output terminal of the optical multiplexing element, and functioning to reflect the light multiplexed at the optical multiplexing element at a low reflection coefficient.

In addition, a multiple wavelength excitation light source. is formed characterized in that respective lasers are connected to the input terminals of the optical multiplexing elements in this multiple wavelength excitation optical multiplexing device. In addition, an optical amplifier is formed by incorporating this multiple wavelength excitation light source.

The following effects can be obtained in the present invention's multiple wavelength excitation optical multiplexing device and multiple wavelength excitation light source.

Namely, the respective oscillation wavelengths of the lasers are determined by the optical multiplexing element. Therefore, even if the transmission characteristics of the optical. multiplexing element vary due to temperature changes, the oscillation wavelength of the laser varies in concert with this change. As a result, the power of the multiplexed light obtained via the optical multiplexing element does not readily change due to temperature variations, so that it becomes possible to provide a stable high output excitation light.

Accordingly, temperature control of the optical multiplexing element can be relaxed, and structural elements such as the reflecting elements, etc., are not required to. have as high a wavelength accuracy. Moreover, there are a fewer number of parts as compared to the conventional design in which one reflecting element was employed per laser. Thus, it is possible to reduce loss and part costs, so that the present invention is economical.

Further, by incorporating the present invention's multiple wavelength excitation light source in an optical amplifier, it is possible to obtain a high output optical amplifier suitable for use in a wavelength multiplex transmission mode optical communications system.

BRIEF DESCRIPTION OF THE DRAWINGS

FIG. 7 is an explanatory diagram showing an example of the method for manufacturing a fiber grating to form a periodical changes in the core's index of refraction.

DESCRIPTION OF THE PREFERRED EMBODIMENTS

Figure 1:
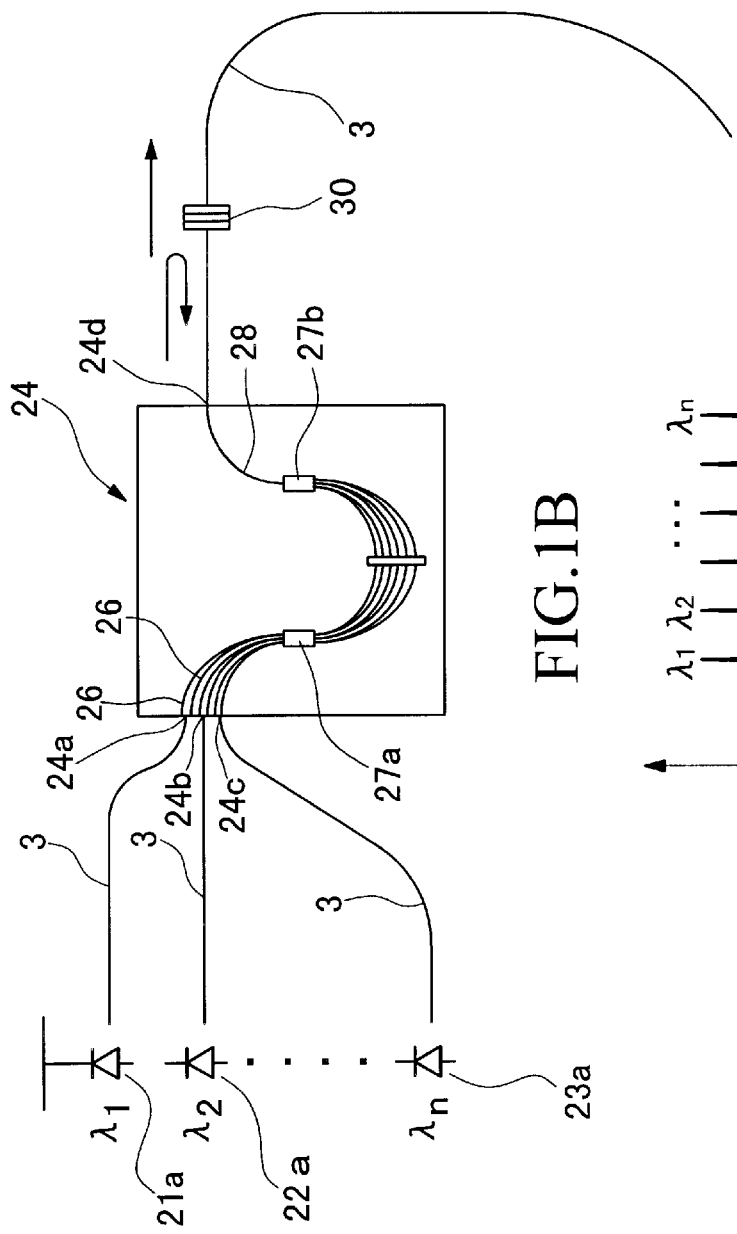
FIG. 1A is a schematic diagram showing an embodiment of the present invention's multiple wavelength excitation optical multiplexing device and a multiple wavelength excitation light source incorporating this device.
FIG. 1B is a graph showing the wavelength spectrum obtained in this multiple wavelength excitation light source.
Figures 15A, 15B:
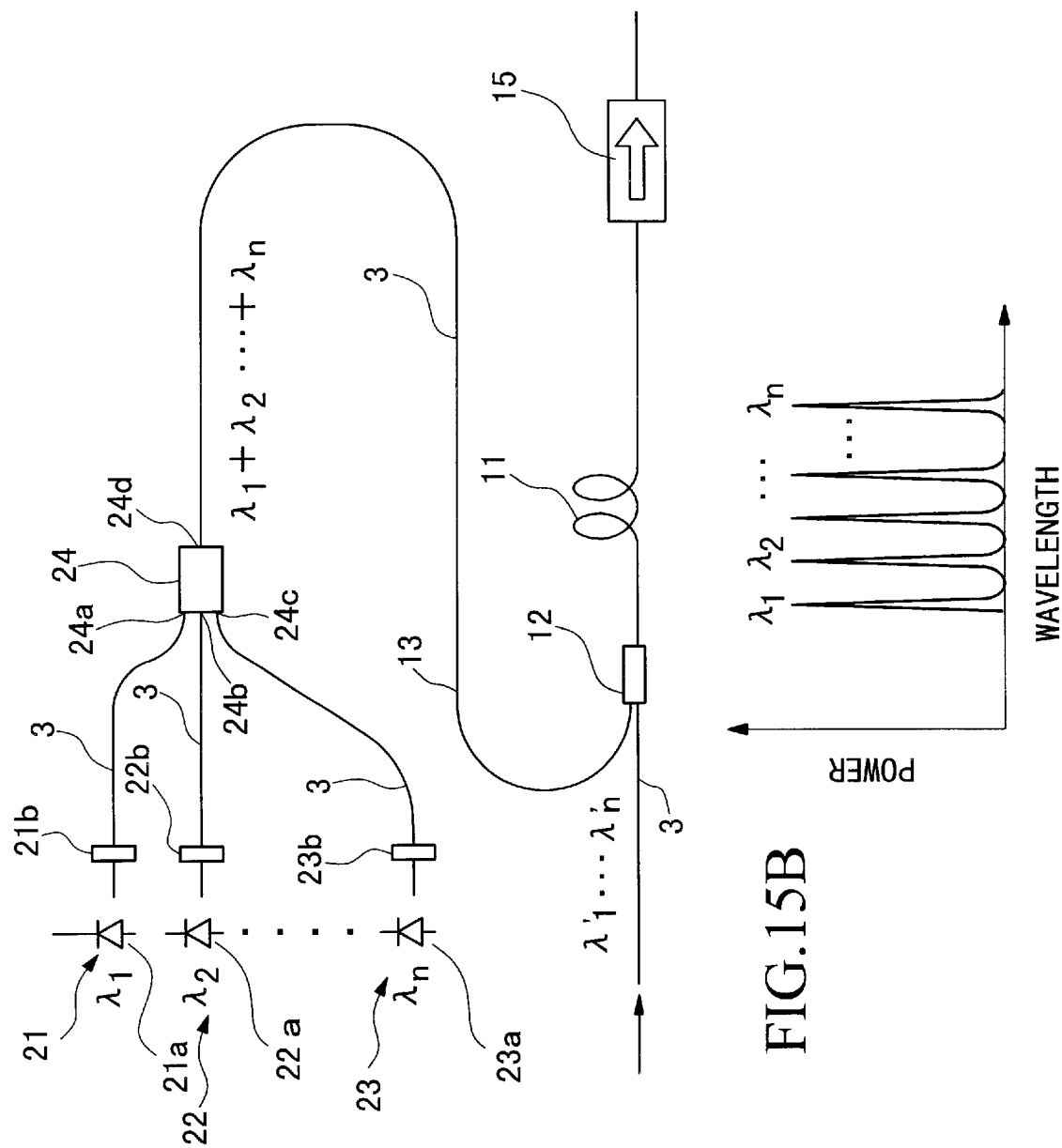
FIG. 15A is a schematic structural diagram of one example of a wavelength multiplex mode multiple wavelength excitation light source employing the laser oscillating element shown in FIG. 14A and an optical amplifier incorporating this source.
FIG. 15B is a graph showing the wavelength spectrum of the excitation light obtained in this multiple wavelength excitation light source.

FIG. 1A shows the present invention's multiple wavelength excitation optical multiplexing device and an embodiment of a multiple wavelength excitation light source (laser oscillating element) incorporating this device. The structural elements which are identical to those shown in FIGS. 15A and 15B have been assigned the same numerical symbol and an explanation thereof will be omitted.

Namely, a multiple wavelength excitation optical multiplexing device consists of optical multiplexing element 24 and reflecting element 30 which is inserted along optical fiber 3 which is connected to output terminal 24d.

The multiple wavelength excitation light source consists of this multiple wavelength excitation optical multiplexing device and n Fabry-Perot lasers 21a, 22b, ... 23b, which are connected respectively to input terminals 24a, 24b, ..., 24c of n array waveguides 26 of this optical multiplexing element 24, via optical fibers (pig-tail) 3.

Reflecting element 30 may be provided near the output side of output terminal 24d of optical multiplexing element 24 in this multiple wavelength excitation optical multiplexing device. The distance between optical multiplexing element 24 and reflecting element 30 are not particularly restricted. For example, the distance between output terminal 24d and reflecting element 30 is preferably about 3 m or less.

In this example, Fabry-Perot lasers 21a, 22a, ... 23a are employed as the light source. However, the light source is not limited to a Fabry-Perot laser, provided that the light source is a multiple mode laser with vertical modes, and is a semiconductor laser which can oscillate light in the desired excitation wavelength band.

The Fabry-Perot lasers 21a, ..., 23a employed in this example have an oscillation wavelength corresponding to the 1460~1490 nm band, which is the excitation wavelength band of the EDFA.

Figure 2:
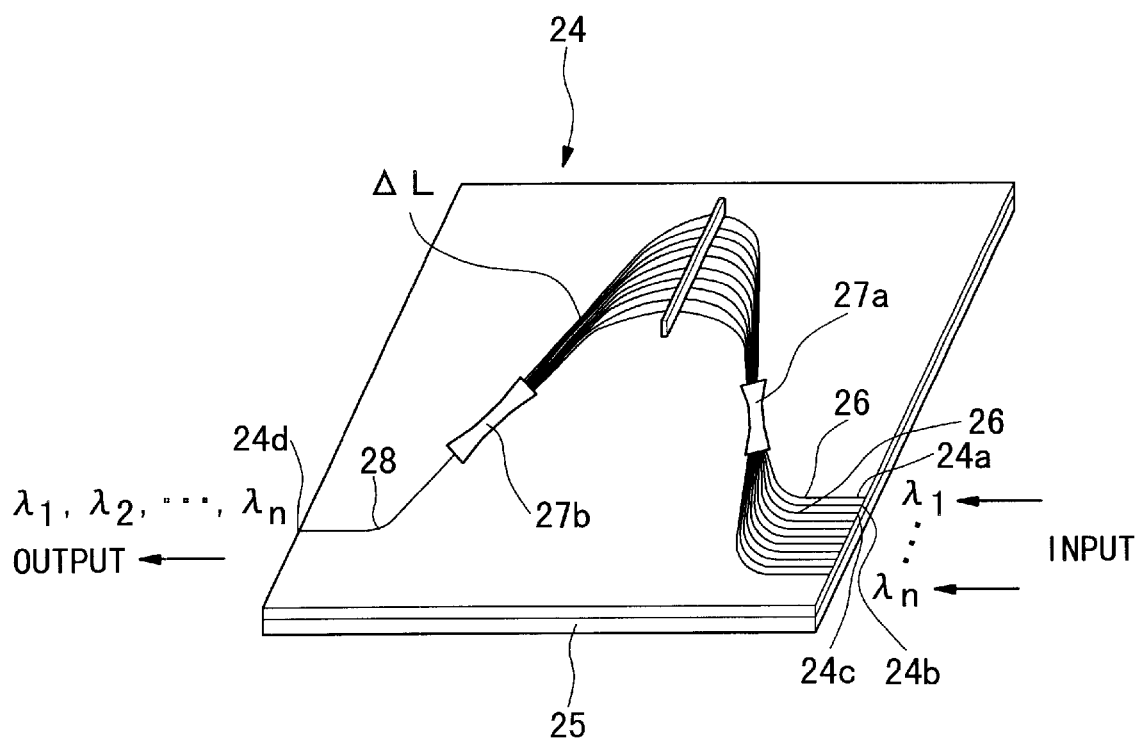
FIG. 2 is an explanatory diagram showing an arrayed waveguide grating optical multiplexing circuit as an example of an optical multiplexing element.

As one example of optical multiplexing element 24, FIG. 2 shows a multiplexing element referred to as an Arrayed Waveguide Grating (AWG) type optical multiplexing circuit.

In this AWG, a plurality of approximately U-shaped array waveguides 26,26 ... are provided roughly in parallel on substrate 25. The waveguide difference (difference in length of the light paths) between adjacent array waveguides 26 is set to be ΔL.

Slab waveguides 27a,27b are provided to the input and output sides of these arrayed waveguides 26, for interfering with the lights being guided through the plurality of array waveguides 26. One waveguide 28 is provided further to the rear of the slab waveguide 27b on the output side.

Namely, in this AWG, the ends on the input side of array waveguide 26 form the plurality of input terminals 24a,24b, 24c ..., while the end on the output side of waveguide 28 is output terminal 24d.

At slab waveguide 27a on the input side, lights of wavelength $\lambda 1, \lambda 2 ... \lambda n$ which are input to respective array waveguides 26 from input terminals 24a,24b ... are distributed to array waveguides 26 which are to the rear of slab waveguide 27a. A waveguide difference is generated while passing through these array waveguides 26, with the lights interfering and multiplexing at slab waveguide 27b on the output side, passing through wave guide 28 and being output from output terminal 24d.

A silicon substrate or the like may be employed as substrate 25. This AWG may be formed, for example, by providing a quartz thin film onto the silicon substrate, and doping germanium into this quartz thin film layer following the waveguide pattern.

Because it has high resolution spectral characteristics, an AWG is suitably employed in wavelength multiplex modes.

Figure 3:
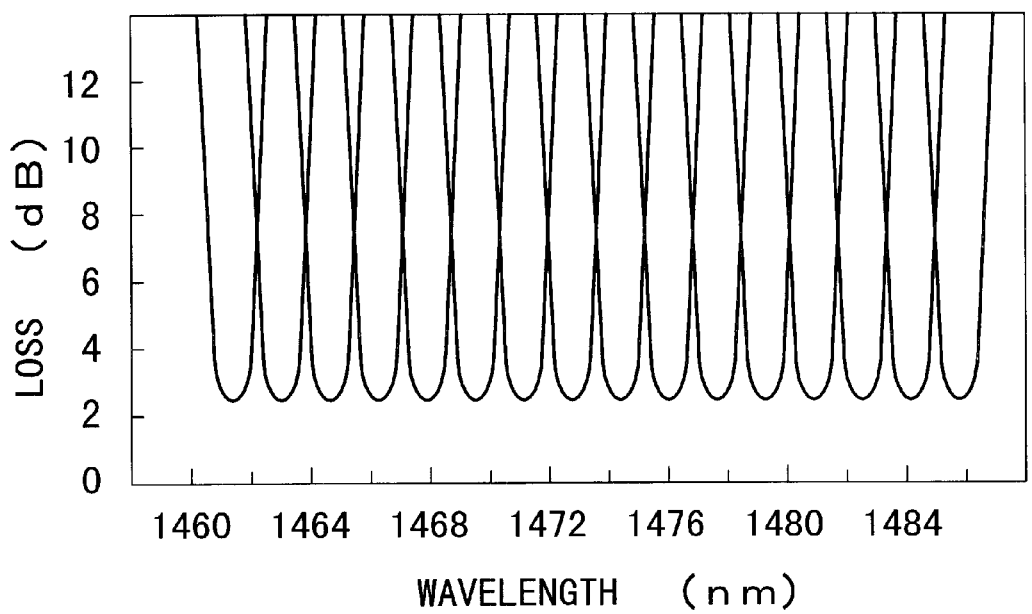
FIG. 3 is a graph showing the wavelength-loss characteristics of the AWG used in the example shown in FIG. 1A.

The AWG in this example has the wavelength-loss characteristics shown in FIG. 3. Namely, lights having specific narrow wavelength bands are transmitted in respective array waveguides 26. In the 1460~1490 nm excitation wavelength band, the wavelengths $\lambda 1, \lambda 2, \lambda n$ of the transmitted lights in these array waveguides 26 differ at each specific interval. Specifically, in this example, each wavelength interval is set to be approximately 1.6 nm centered about 1470 nm.

Reflecting element 30 reflects light in the aforementioned excitation wavelength band at a comparatively low reflection coefficient.

The reflection coefficient of reflecting element 30 should be set in accordance with the characteristics of the laser (Fabry-Perot laser 21a, ..., 23a). For example, in the case of a Fabry-Perot laser for oscillating light in the 980 nm and 1480 nm wavelength regions that are employed in the excitation of a EDFA having the structure as shown in FIG. 11B, a suitable solution can be obtained when the reflection coefficient is set to about 2~10%.

Figure 4:
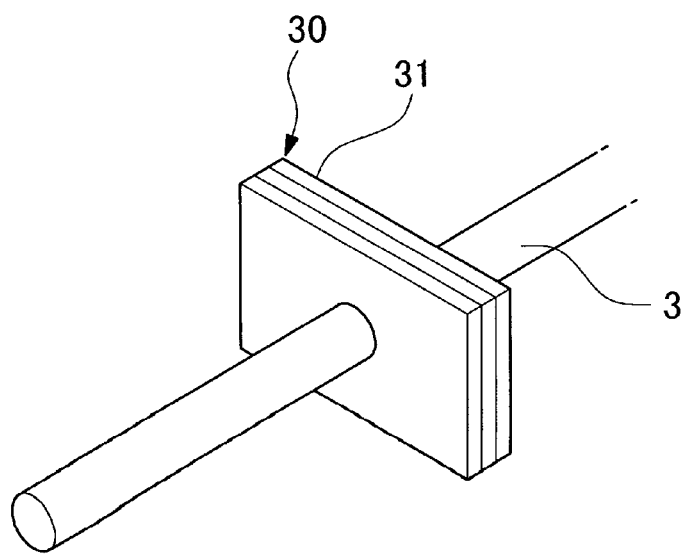
FIG. 4 is a perspective view showing a multilayer interference filter consisting of a dielectric multilayer employed in the example shown in FIG. 1A.

In this example, a multilayer interference filter 31 consisting of the dielectric multilayer shown in FIG. 4 is employed as reflector 30. With this multilayer interference filter 31, a reflection coefficient of about 5% can be obtained at around 1460~1480 nm.

An explanation now follows focusing on one of the array waveguides. 26 in optical multiplexing element (AWG) 24, and one of the Fabry-Perot lasers that is connected to the input terminal 24a thereof. This array waveguide 26 is designed so that only light of a narrow band centered on wavelength $\lambda 1$ is transmitted.

When light of a broad wavelength width is incidented on one of array waveguides 26 from Fabry-Perot laser 21a, only light of wavelength $\lambda 1$ which is distributed to this array waveguide 26 progresses toward reflecting element 30 and is output. Light of the specific wavelength $\lambda 1$ is reflected at a relatively low reflection coefficient at reflecting element 30.

The same wavelength is selected for the light transmitted through array waveguide 26 in the case where the light is being transmitted from the input side to the output side, and in the case where the light is being transmitted from the output side to the input side. Thus, reflecting light incidents on optical multiplexing element 24 from output terminal 24d, is transmitted through the same array waveguide 26, and reaches Fabry-Perot laser 21a.

Light corresponding to wavelength $\lambda 1$ of this reflected light is oscillated from Fabry-Perot laser 21a.

The wavelength transmitted through array waveguide 26 at this multiple wavelength excitation light source becomes the wavelength (oscillation wavelength) of the light oscillated from Fabry-Perot laser 21a.

This effect is the same at second Fabry-Perot laser 22a ... nth Fabry-Perot laser 23a, respectively. The oscillation wavelength of Fabry-Perot lasers 22a, ... 23a are set according to wavelength $\lambda 2, ... \lambda n$ which are transmitted through array waveguides 26 to which these Fabry-Perot lasers 22a, ..., 23a are connected.

For this reason, after the lights oscillated from Fabry-Perot lasers 21a,22a, ... 23a, respectively, are multiplexed at optical multiplexing element 24, then a wavelength spectrum such as shown in FIG. 1B is obtained in which a plurality of narrow band $\lambda 1, \lambda 2, ... \lambda n$ peaks are aligned at specific intervals. Namely, the wavelength spectrums of the lights outputted from each Fabry-Perot lasers 21a, 22a, . . . , 23a correspond to these narrow band λ1, λ2, . . . λn peaks, respectively.

In this way, the oscillation wavelengths for Fabry-Perot lasers 21a, 22a, . . . 23a are determined according to the selected wavelength characteristics (transmission characteristics) of array waveguides 26 of optical multiplexing element 24 in this multiple wavelength excitation light source.

For this reason, even if the transmission wavelengths of the plurality of array waveguides 26 parallel shift on the wavelength axis by just the same wavelength width due to environmental temperature changes for example, the oscillation wavelengths of Fabry-Perot lasers 21a, . . . 23a will be set based on these shifted transmission wavelengths. In other words, the oscillation wavelengths of Fabry-Perot lasers 21a, 22a, . . . 23a change in response to changes in the characteristics of optical multiplexing element 24. Accordingly, in the multiple wavelength excitation light source in this example, the resonator as seen from individual Fabry-Perot lasers 21a, . . . 23a is reflecting element 30 which is connected to the output side of AWG.

As a result, even if the characteristics of optical multiplexing element 24 change due to temperature changes, the losses in the lights oscillated from Fabry-Perot lasers 21a, . . . 23a at optical multiplexing element 24 do not readily increase. In other words, the power of the multiplexed light does not readily change due to temperature changes.

In addition, it is not required that reflecting element 30 be highly accurate, provided that it has the property of reflecting light in the wavelength band of the multiplexed light.

More specifically, the transmission wavelength characteristics of the AWG have a temperature dependence of 0.013 nm/°C., for example. Accordingly, when employing an AWG as optical multiplexing element 24 without performing temperature compensation, if the temperature during use changes 50° C., then the transmission wavelength of the AWG parallel shifts 0.65 nm on the wavelength axis. In other words, the wavelength of the excitation light (multiplexed light) obtained from optical multiplexing element 24 changes 0.65 nm.

Figure 12:
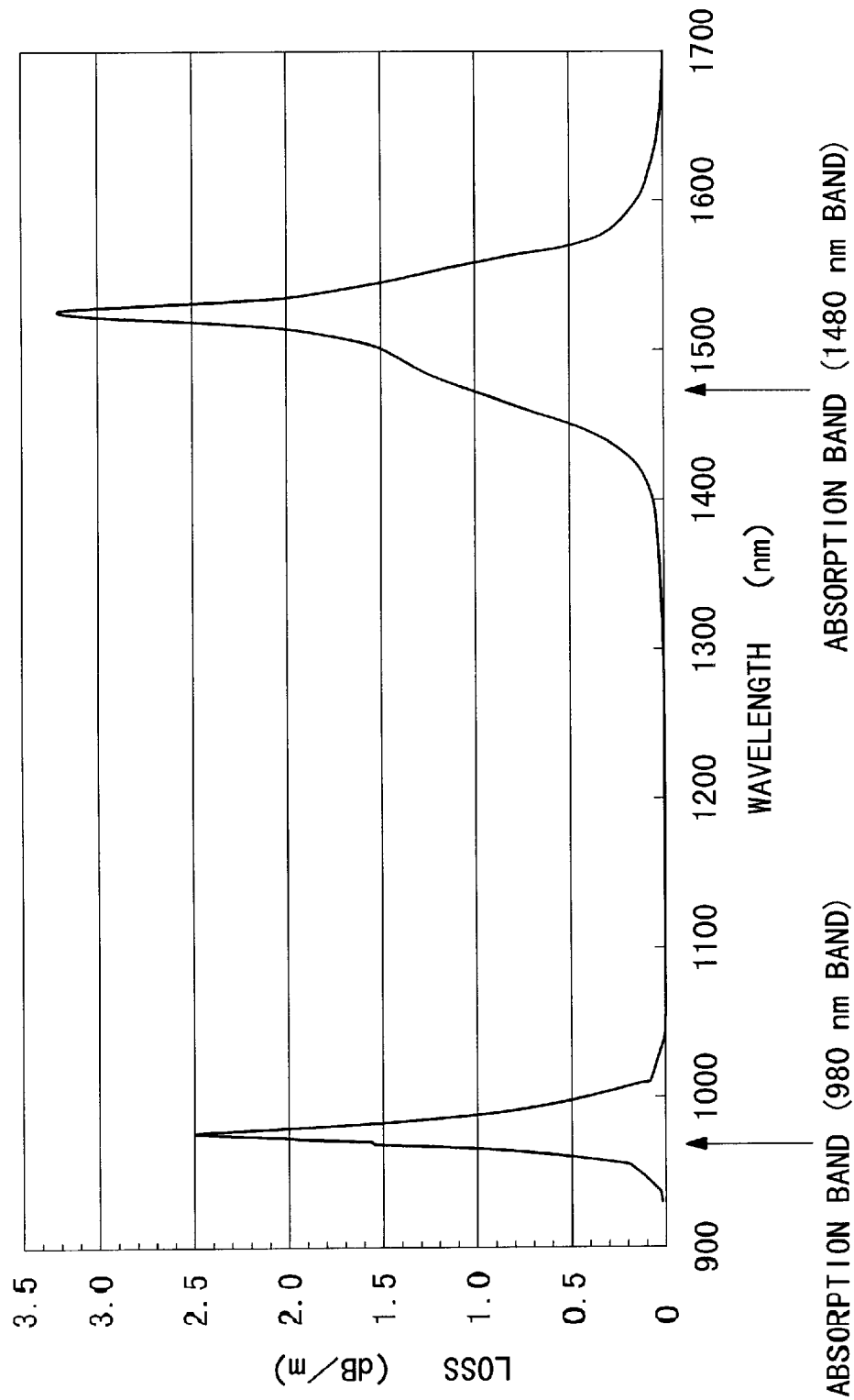
FIG. 12 is a graph showing an example of the absorption spectrum of a 1.5 $\mu$m band amplifying erbium doped optical fiber.
Figure 13:
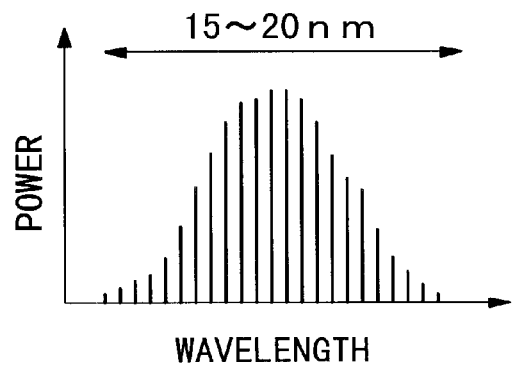
FIG. 13 is a graph showing the oscillation wavelength of the output of a Fabry-Perot laser.
Figure 14A:
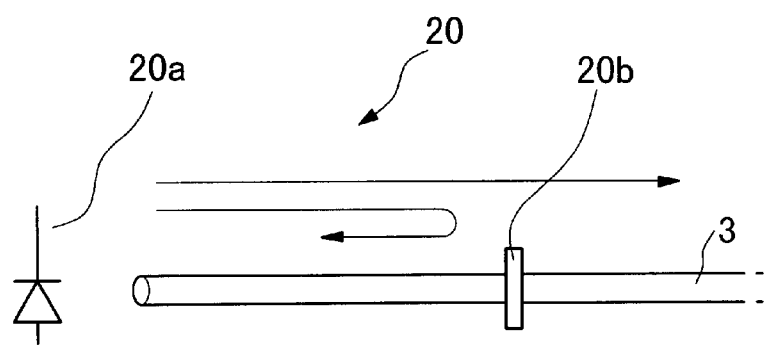
FIG. 14A is a schematic structural diagram showing a laser oscillating element consisting of a Fabry-Perot laser and a reflecting element.
Figure 14B:
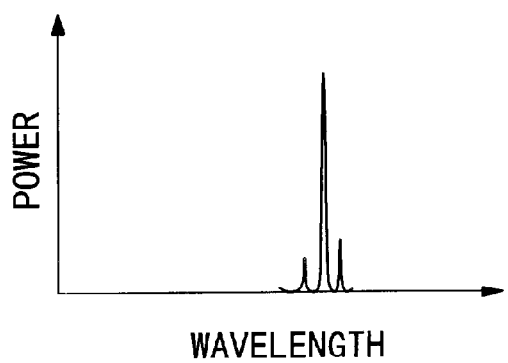
FIG. 14B is a graph showing the wavelength spectrum of the light obtained in this laser oscillating element.

In an EDFA, as shown in FIG. 12, the wavelength width of the excitation light which can be used is relatively broad. Thus, in the case of excitation with multiple lasers, this 0.65 nm wavelength shift in the multiplexed light due to a 50° C. temperature change is within permissible limits for a wavelength band capable of excitation. In other words, even if the wavelength of the multiplexed light changes to this extent, the light signal can be sufficiently amplified at the EDFA.

In this way, in the above-described multiple wavelength excitation optical multiplexing device and the multiple wavelength excitation light source incorporating this device, it is possible to relax the temperature restrictions on the optical multiplexing element. Moreover, the wavelength accuracy of structural parts such as the reflecting element does not need to be as high. In addition, there are a fewer number of parts as compared to the conventional structure employing one reflecting element per laser. Thus, it is possible to reduce loss and part costs, so that the present invention is economical.

Figure 11A:
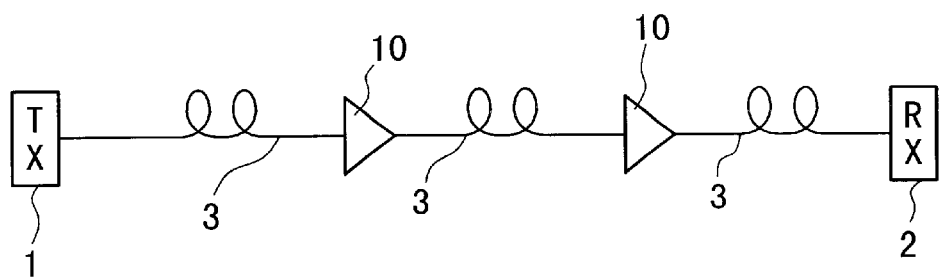
FIG. 11A is a schematic structural diagram showing an example of the long distance optical fiber communications system employing an optical amplifier.
Figure 11B:
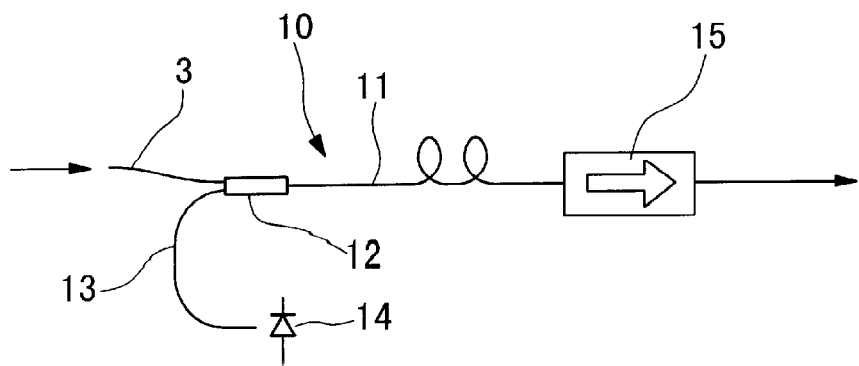
FIG. 11B is a schematic structural diagram showing an example of an optical amplifier.

Moreover, by incorporating this multiple wavelength excitation light source into the optical amplifier shown in FIGS. 11A and 11B for example, a high output amplifier can be obtained which is suitable for use in a wavelength multiplex mode optical communications system.

The present invention's multiple wavelength excitation optical multiplexing device and the multiple wavelength excitation light source have this high output as described above. Thus, they may be suitably employed not only in the optical communications field, but also in the optical amplifiers and their laser excitation light sources that are used in optical measurements, laser processing, etc.

In the multiple wavelength excitation optical multiplexing device shown in FIG. 1A, a device other than the AWG described above may be used for optical multiplexing element 24. The determination of the oscillation wavelengths of Fabry-Perot lasers 21a, 22a, . . . 23a by optical multiplexing element 24 is the same in an optical multiplexing element other than an AWG.

FIGS. 5 and 6 show another example of an optical multiplexing element. This optical multiplexing element is an element with high applicability incorporating a Mach-Zehnder optical filter.

Figure 5A:
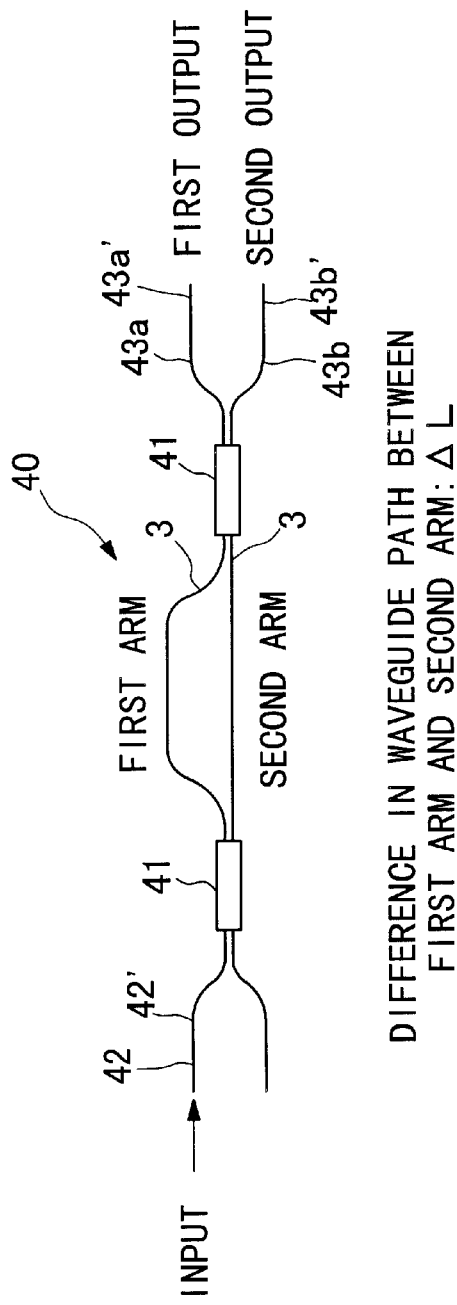
FIG. 5A is a schematic structural diagram showing the basic form of the Mach-Zehnder optical filter.

FIG. 5A shows the basic form of a Mach-Zehnder optical filter. This basic form 40 is designed so that the area between two optical fiber couplers 41,41 is connected by first and second arms, which are interferometers. First arm and second arm consist of optical fibers 3,3, which have different lengths. The difference in these waveguide paths is ΔL.

The typical fusion-drawn product may be employed for optical fiber coupler 41, for example, in which two optical fibers are aligned in parallel, and there are two input terminals and two output terminals each which are formed by fusion-drawing along the optical fibers.

The operation of multiplexing and demultiplexing the light at basic form 40 will now be explained using as an example the case where one input terminal 42 and two output terminals 43a,43b are set. With regard to the unused terminal, it is preferable to subject it to an antireflection treatment by the usual method.

Figure 5B:
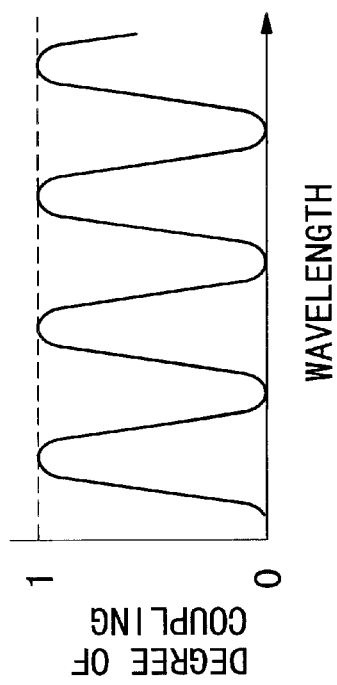
FIG. 5B is a graph showing the wavelength-coupling characteristics obtained in this basic form.

FIG. 5B is a graph showing the wavelength-degree of coupling relationship at basic form 40. The degree of coupling expresses the proportion of light incidenting on one optical fiber that is coupled to another optical fiber, for example. As shown by this graph, the characteristics at which the degree of coupling changes periodically with respect to the wavelength are obtained at basic form 40 based on waveguide difference ΔL from the first to the second arm.

In other words, when light from input terminal 42 is input, then, in the graph shown in FIG. 5B, light of a wavelength having a low degree of coupling is output from first output terminal 43a (first output), while light of a wavelength having a high degree of coupling is output from second output terminal 43b (second output).

The characteristics for selecting the wavelength are the same in the case where the input terminals are reversed. For example, conversely to the case described above, when light of a comparatively broad wavelength is input to first input terminal 43a' and second input terminal 43b', multiplexed light divided to first input terminal 43a' and second input terminal 43b' that is in a narrow band having a specific wavelength is output from output terminal 42'.

Basic form 40 can be employed as a multiplexing element for multiplexing two lights having different wavelengths respectively. In the case where multiplexing three or more lights having different wavelengths respectively, however, basic form 40 has the structure shown in FIG. 6A, for example.

Figure 6A:
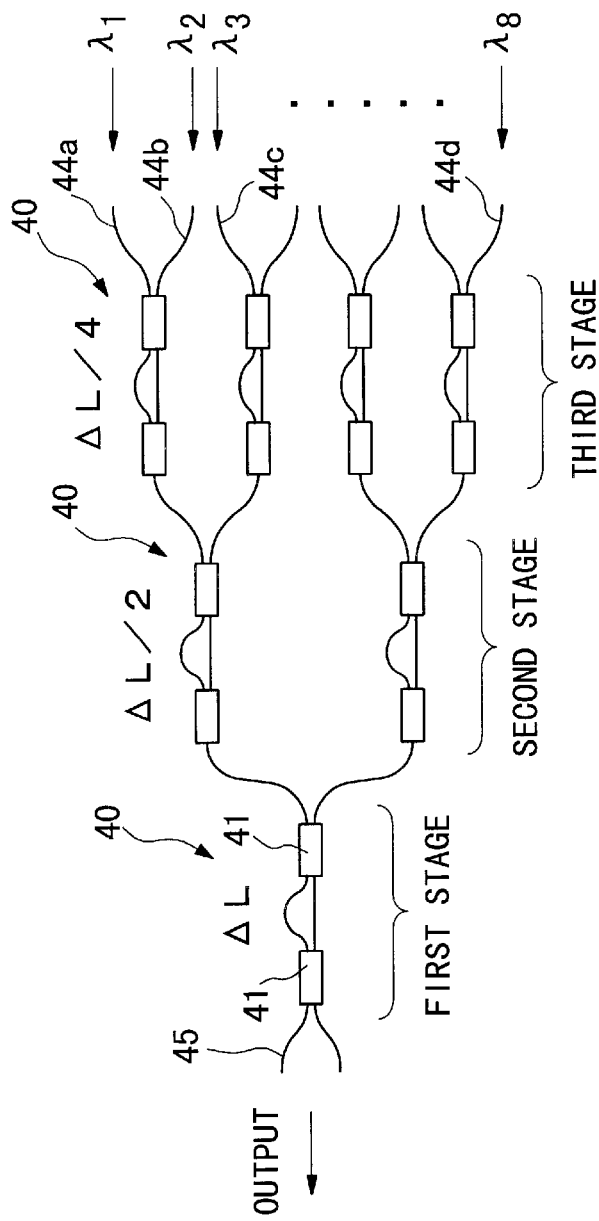
FIG. 6A is a schematic structural view showing the optical multiplexing element incorporating the basic form shown in FIG. 5A.

In FIG. 6A, an optical multiplexing element for multiplexing eight lights is formed by connecting in three stages 2×1 basic forms 40 having two input terminals and one output terminal, to form a waveguide for selectively transmitting lights of eight wavelengths. The input terminals of the waveguides are indicated by 44a, 44b, 44c . . . 44d in the figure.

In this optical multiplexing element, the two basic form output terminals in the second stage are respectively connected to each of the two basic form input terminals in the first stage on their output side, and the four basic form output terminals in the third stage are each connected to the total of four basic form input terminals in the second stage.

Figure 6B:
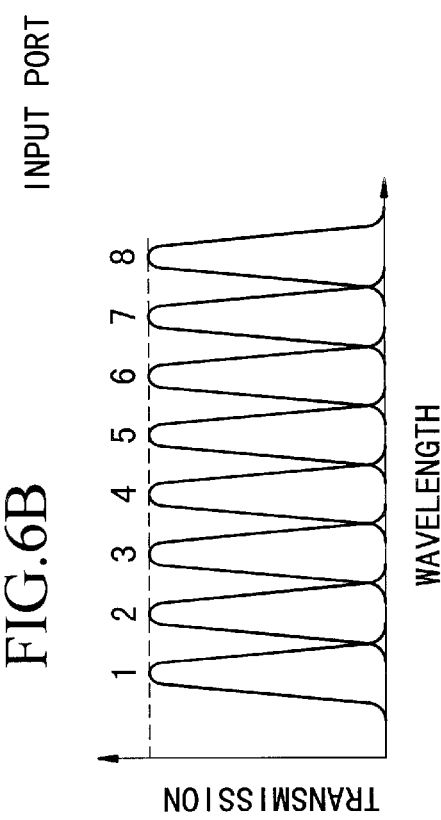
FIG. 6B is a graph showing the wavelength spectrum obtained in this optical multiplexing element.

In this optical multiplexing element, as shown in FIG. 6B, when lights are input to input terminal 44a, . . . 44d, lights of the specific wavelengths λ1, λ2, . . . λ8 assigned to the respective input terminal are selectively transmitted. These transmitted lights are multiplexed and output from output terminal 45.

In addition to employing the dielectric multilayer disclosed in the preceding example, it is also possible to use a so-called reflecting fiber bragg grating as the reflecting element 30 shown in FIG. 1A.

In this fiber grating, a perturbation, such as periodical changes in the core refractive index or core diameter, is formed along the length of the optical fiber. As a result of the action of these periodical changes, characteristic reflection of light of a specific wavelength band can be obtained.

FIG. 7 shows an example of a method for making a fiber grating in which periodical changes are formed in the core refractive index.

First, an optical fiber 3 is prepared which is provided with a central core 3a and a cladding 3b which has a lower refractive index than core 3a. Core 3a consists of germanium doped quartz glass. Cladding 3b is pure quartz glass or fluorine doped quartz glass.

The property whereby the refractive index increases upon irradiation with ultraviolet light of a specific wavelength (i.e., the so-called photo-refractive effect) is considerable in germanium, which is typically employed as a doping agent in optical fibers to increase the refractive index. For this reason an optical fiber 3 provided with a core 3a consisting of germanium doped quartz glass is suitably employed as the material fiber for a fiber grating.

Numeric symbol 52 indicates a phase mask. This phase mask 52 consists of quartz glass etc and has a plurality of grids 52a formed to one surface at a fixed periodic.

Next, as shown in FIG. 7, phase mask 52 is disposed to the lateral surface of optical fiber 3 so that the surface on which grids 52a are formed faces optical fiber 3. Ultraviolet light is then radiated onto the lateral surface of optical fiber 3 via phase mask 52.

As a result, +1 order diffracted light and a −1 order diffracted light are diffracted by grids 52a . . . to generate interference fringes, thereby forming an intensity pattern for the ultraviolet light. As a result, the refractive index of the portion of core 3a which generated these interference fringes changes, and the intensity pattern of the ultraviolet light is copied onto core 3a as semipermanent refractive index changes. In this way, a grating portion 53 is formed in which periodical changes in the refractive index of core 3a are formed along the length of optical fiber 3.

Since it is necessary that the fiber grating cover the entire oscillation wavelength region for a plurality of lasers, for example, it is preferable that the grating have relatively broad reflection wavelength characteristics.

Accordingly, a so-called chirped fiber grating having a broad reflection wavelength band is desirable. The periodic (referred to as grating pitch) of the periodical change is not constant, but rather changes, along the length of the optical fiber in a chirped fiber grating. For example, a design has been disclosed in which the grating pitch is narrowest around the center of the grating portion, with the grating pitch gradually broadening toward either end of the grating portion.

In the example shown in FIG. 7, for example, the grating pitch can be adjusted by changing the periodic of grid 52a.

In addition, the characteristics of the fiber grating such as its reflection coefficient, the reflection wavelength band, etc., are suitably adjusted based on the characteristics demanded. The characteristics of the fiber grating can be varied by changing, the grating pitch, the amount of change in the grating pitch, the grating length, the amount of change in the refractive index, and the like.

Figure 8:
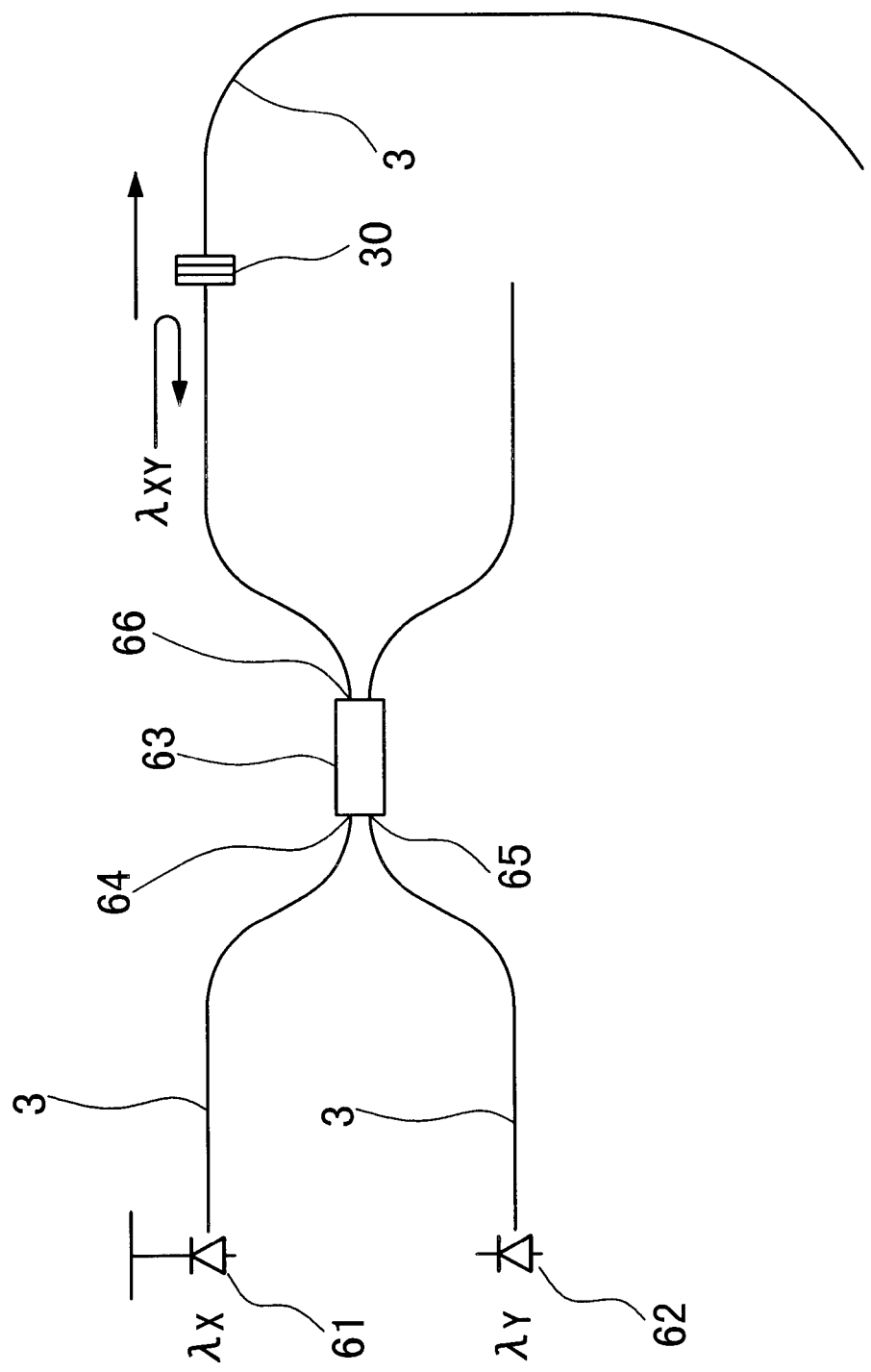
FIG. 8 is a schematic structural diagram showing another example of the present invention's multiple wavelength excitation optical multiplexing device and the multiple wavelength excitation light source employing this device.

FIG. 8 shows another example of the present invention's multiple wavelength excitation optical multiplexing device and a multiple wavelength excitation light source employing this device.

In the figure, the numeral 63 is a polarization-preserving optical coupler. Fabry-Perot lasers 61,62 are connected via light fibers (pig-tail) 3,3 to the two input terminals 64,65 of this polarization-preserving optical coupler 63. A reflecting element 30 is inserted on the output side of output terminal 66 to optical fiber 3, which is connected to the output terminal 66 of polarization-preserving optical coupler 63. In other words, in this example, a multiple wavelength excitation optical multiplexing device is formed from polarization-preserving optical coupler 63 and reflecting element 30, and a multiple wavelength excitation light source is formed by connecting Fabry-Perot lasers 61,62 to this device.

The typical fusion-drawn product may be employed for polarization-preserving optical coupler 63 in which two polarization-preserving optical fibers are aligned and there are two input terminals and two output terminals each formed by fusion-drawing along the optical fibers. In this example, it is preferable to perform an antireflection treatment to one of the output terminals by the usual method. A PANDA polarization-preserving optical fiber or the like may be used as the polarization-preserving optical fiber.

When, for example, X polarized wave light (λx) and Y polarized wave light (λy) having identical wavelengths are input to respective input terminals 64,65 in polarization-preserving optical coupler 63, then multiplexing is carried out while preserving their polarization states, and multiplexed light (λxy) that includes X polarized wave light and Y polarized wave light are output from output terminal 66. Conversely, when the multiplexed light of the X polarized wave light and Y polarized wave light are input from output terminal 66, then the X polarized wave light and the Y polarized wave light are demultiplexed at input terminals 64,65 respectively.

Accordingly, When X polarized wave light and Y polarized wave light which have specific wavelength widths are each input from Fabry-Perot lasers 61,62, these lights are multiplexed at polarization-preserving optical coupler 63, reach the reflecting element 30 that is inserted in optical fiber 3 from output terminal 66, and are reflected. This reflected light incidents from output terminal 66 onto polarization-preserving optical coupler 63, and X polarized wave light and Y polarized wave light are demultiplexed at input terminals 64,65. As a result, X polarized wave light and Y polarized wave light of a specific wavelength are output from Fabry-Perot lasers 61,62. Thus, multiplexed light is obtained from output terminal 66 which has the same wavelength as the wavelength of the reflected light from reflecting element 30, and which is provided with a light power that is the total of the X polarized wave light and the Y polarized wave light. In this case, as well, a suitable solution can be obtained when the reflection coefficient of reflecting element 30 is in the range of 2~10%.

Figure 9:
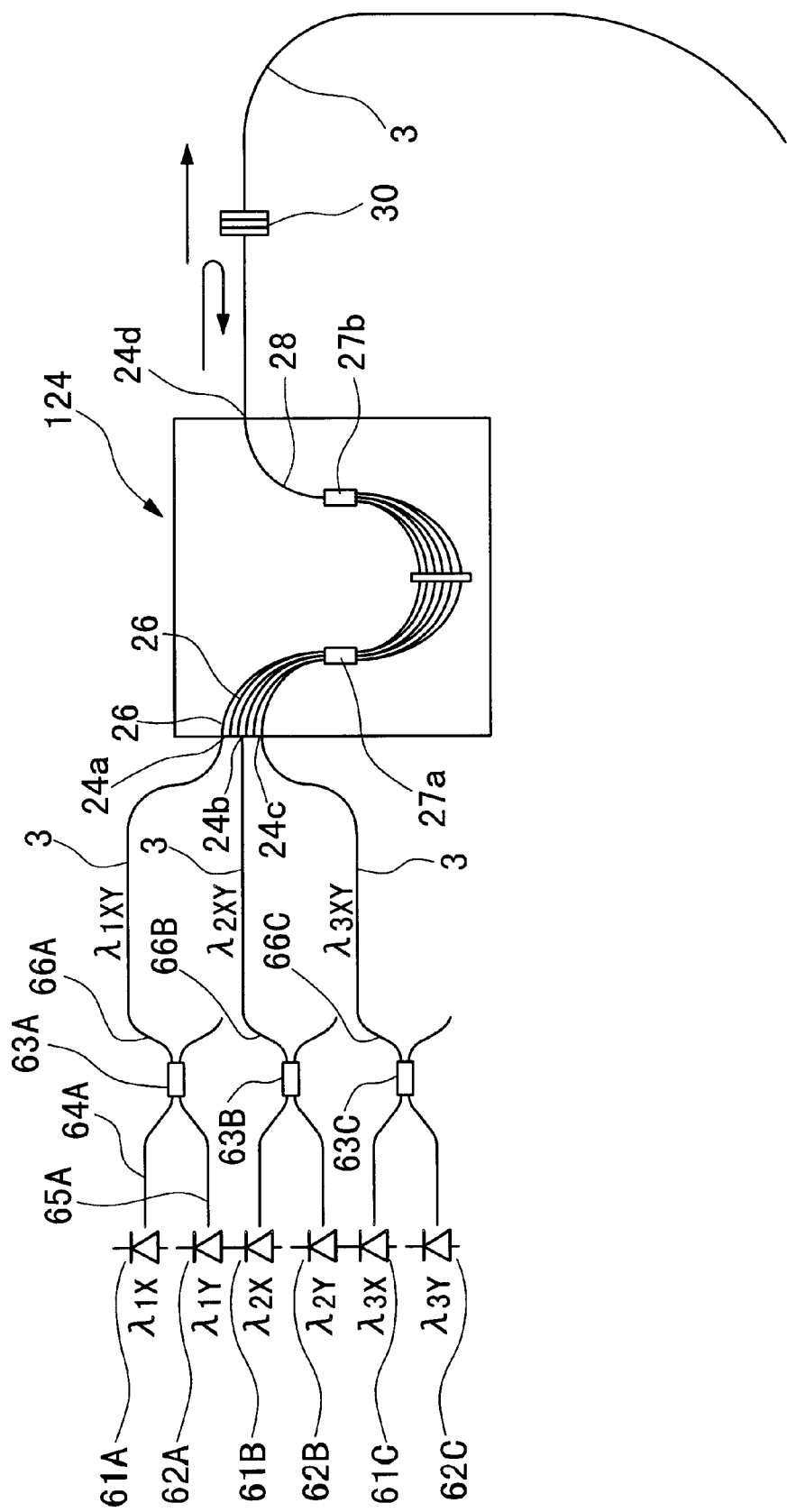
FIG. 9 is a schematic structural diagram showing an example of the device structure for outputting light of a plurality of wavelengths using a polarization-preserving optical coupler in the present invention's multiple wavelength excitation optical multiplexing device and the multiple wavelength excitation light source employing this device.
Figure 10A:
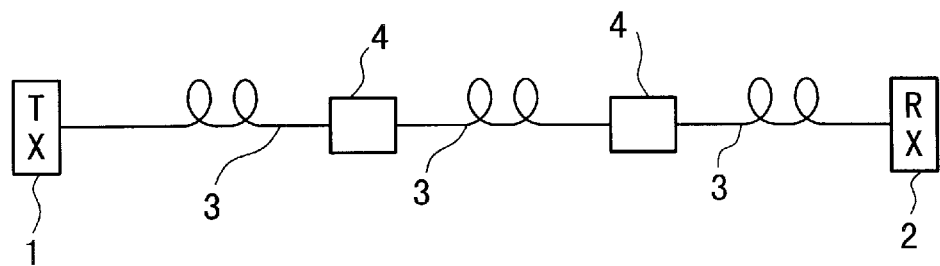
FIG. 10A is a schematic structural diagram showing an example of a conventional long distance optical fiber communications system.
Figure 10B:
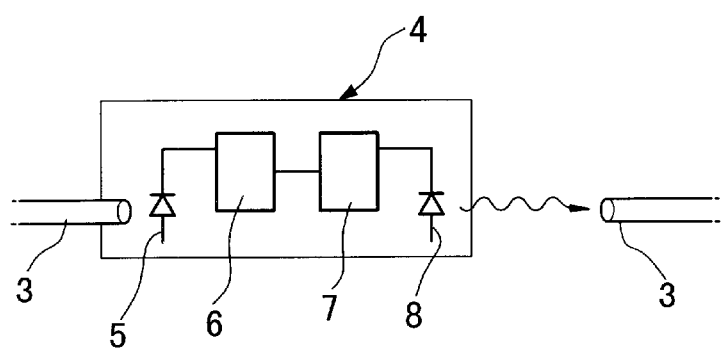
FIG. 10B is a schematic structural diagram showing an example of the structure of the regenerative repeater employed in FIG. 10A.

FIG. 9 shows an example of the structure of the device for outputting light of a plurality of wavelengths employing a polarization-preserving optical coupler.

In this example, polarization-preserving optical couplers 63A, 63B, 63C which are identical to the polarization-preserving optical coupler 63 shown in FIG. 8 are aligned, with their output terminals 66A, 66B, 66C connected to input terminals 24a, 24b, 24c of optical multiplexing device 124 via optical fibers (pig-tail) 3.

Reflecting element 30 is inserted near output terminal 24d of optical fiber 3 which is connected to output terminal 24d of this optical multiplexing device 124.

Input terminals 64A, 65A of polarization-preserving optical coupler 63A are connected to Fabry-Perot lasers 61A, 62A. Fabry-Perot laser 61A is provided with the function of outputting X polarized wave light provided with a comparatively broad wavelength width, while Fabry-Perot laser 62A is provided with the function of outputting Y polarized wave light provided with a comparatively broad wavelength.

Polarization-preserving optical coupler 63B is connected to Fabry-Perot lasers 61B, 62B which are provided with the same function as Fabry-Perot lasers 61A, 62A. In addition, polarization-preserving optical coupler 63C is connected to Fabry-Perot lasers 61C, 62C in the same way.

In this example, optical multiplexing device 124 is an AWG identical to that shown in FIG. 2. Light of a specific narrow wavelength width is transmitted in respective array waveguides 26. For example, in the 1460~1490 nm excitation wavelength band, the wavelengths $\lambda 1, \lambda 2, \ldots \lambda n$ of the transmitted lights in these plurality of array waveguides 26 are different at each specific interval. Specifically, in this example, each wavelength interval is set to be approximately 1.6 nm centered about 1470 nm.

First, X polarized wave light and Y polarized wave light provided with a specific wavelength width are input to input terminals 64A, 65A of polarization-preserving optical coupler 63A from Fabry-Perot lasers 61A, 62A.

As a result, these lights are multiplexed while preserving their polarization states in this polarization-preserving optical coupler 63A. The multiplexed light output from output terminal 66A is reflected at a low reflection coefficient at reflection element 30 after passing through optical multiplexing device 124. This reflected light is incidented on optical multiplexing device 124 from output terminal 66A, and passes through array waveguide 26 of optical multiplexing device 124. As a result, light having a specific wavelength of $\lambda 1XY$ which was demultiplexed at array waveguide 26 is selectively supplied to polarization-preserving optical coupler 63A.

This light is demultiplexed into X polarized wave light ($\lambda 1X$) and Y polarized wave light ($\lambda 1Y$) after passing through polarization-preserving optical coupler 63A, and then reaches Fabry-Perot lasers 61A, 62A from respective input terminals 64A,65A.

As a result, the oscillation wavelength of Fabry-Perot lasers 61A,62A becomes the wavelength which was demultiplexed by array waveguide 26 that is connected to output terminal 66A. X polarized wave light ($\lambda 1X$) and Y polarized wave light ($\lambda 1Y$) provided with this wavelength are then outputted from Fabry-Perot lasers 61A,62A, respectively.

In this case as well, a reflection coefficient for reflecting element 30 on the order of 2~10% is suitable.

Similarly, X polarized wave light ($\lambda 2X$) and Y polarized wave light ($\lambda 1Y$) provided with a wavelength demultiplexed at array waveguide 26 connected to X output terminal 66B is outputted from Fabry-Perot lasers 61B,62B.

X polarized wave light ($\lambda 3X$) and Y polarized wave light ($\lambda 3Y$) provided with a wavelength demultiplexed at array waveguide 26 connected to X output terminal 66C is outputted from Fabry-Perot lasers 61C,62C.

As a result, light outputted via reflecting element 30 becomes multiplexed light consisting of $\lambda 1XY$, $\lambda 2XY$ and $\lambda 3XY$ light formed by multiplexing X polarized wave light and Y polarized wave light. Thus, large power can be obtained.

In addition to an AWG, a Mach-Zehnder optical filter, a Mach-Zehnder optical filter incorporating multiple stages as shown in FIG. 6 or the like may be employed as optical multiplexing device 124.

In addition, a reflective fiber grating, a multilayer interference filter employing a dielectric multilayer identical to that described above, or the like may be employed as reflecting element 30.

Also, note that as maybe understood from the preceding example, "a plurality of lights that have different characteristics" as employed in the present invention indicates various lights having different wavelengths or polarization states.

EXAMPLE

The present invention will now be explained in greater detail employing an example.

A light source identical to the multiple wavelength excitation light source shown in FIG. 1A was prepared. Six light sources each having an output (pig-tail output of optical fiber 3 terminal) of approximately 100 mW were employed as Fabry-Perot lasers 21a, 22a, . . . 23a.

When this multiple wavelength excitation light source was incorporated into the EDFA shown in FIG. 11B, multiplexed light having a power of about 350 mW could be input to an erbium doped optical fiber as excitation light, even if transmission loss occurred at optical multiplexing element 24.

In other words, the laser light output from one Fabry-Perot laser was damped from about 100 mW to approximately 58.33 mW due to transmission loss at optical multiplexing element (AWG) 24. As a result, the light output from the six Fabry-Perot lasers forms multiplexed light having a total power of about 350 mW.

The same results were obtained when the equivalent experiment was performed while varying the environmental temperature 50° C.

What is claimed:

1. An excitation light source comprising:

2n lasers, wherein n is an integer greater than 1;

n polarization-preserving optical couplers connected to said lasers;

an optical multiplexing device which multiplexes lights output from said n polarization-preserving optical couplers; and a reflecting element which is inserted into a neighboring output terminal of said optical multiplexing device and has the function of reflecting, at a low reflection coefficient, multiplexed light output from said optical multiplexing device, wherein said 2n lasers comprise a plurality of groups of lasers, each group of lasers comprising a laser for outputting X polarized wave light and a laser for outputting Y polarized wave light which emit lights of the same wavelength, and the wavelengths of the lights emitted from each group mutually differ from each other.

2. An optical amplifier comprising an excitation light source according to claim 1.

3. A multiple wavelength excitation optical multiplexing device according to claim 1 characterized in that said optical multiplexing device is an arrayed waveguide grating optical multiplexing circuit.

4. A multiple wavelength excitation optical multiplexing device according to claim 1 characterized in that said optical multiplexing device consists of a Mach-Zehnder optical filter.

* * * * *